(12) United States Patent
Ochs et al.

(10) Patent No.: US 8,810,252 B2
(45) Date of Patent: Aug. 19, 2014

(54) SOLDER JOINT INSPECTION

(75) Inventors: Eric Ochs, Pittsburgh, PA (US); Holger Hoefer, Sonnenbuehl (DE); Lutz Rauscher, Reutlingen (DE); Eckart Schellkes, Tuebingen (DE); Florian Grabmaier, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 483 days.

(21) Appl. No.: 13/156,208

(22) Filed: Jun. 8, 2011

(65) Prior Publication Data
US 2012/0025863 A1  Feb. 2, 2012

(30) Foreign Application Priority Data
Jul. 27, 2010  (DE) .......................... 10 2010 038 453

(51) Int. Cl.
*G01R 31/08*  (2006.01)

(52) U.S. Cl.
USPC ..................... 324/525; 324/762.03

(58) Field of Classification Search
None
See application file for complete search history.

(56) References Cited

U.S. PATENT DOCUMENTS

2008/0278217 A1*  11/2008  Hankhofer et al. ........... 327/509

FOREIGN PATENT DOCUMENTS

| JP | 2004363146 A | * | 12/2004 | .............. H01L 21/60 |
| JP | 2009065037 A | * | 3/2009 | |

* cited by examiner

*Primary Examiner* — Minh N Tang
(74) *Attorney, Agent, or Firm* — Kenyon & Kenyon LLP

(57) ABSTRACT

An integrated circuit includes an electronic circuit in a housing and a first contacting device for soldering the circuit to a corresponding second contacting device of a circuit board. The first and second contacting devices are each divided into a first section and a second section, the sections of one of the contacting devices being fixedly electrically connected to each other, and the sections of the other contacting device being selectively connectable to a device for resistance determination.

10 Claims, 3 Drawing Sheets

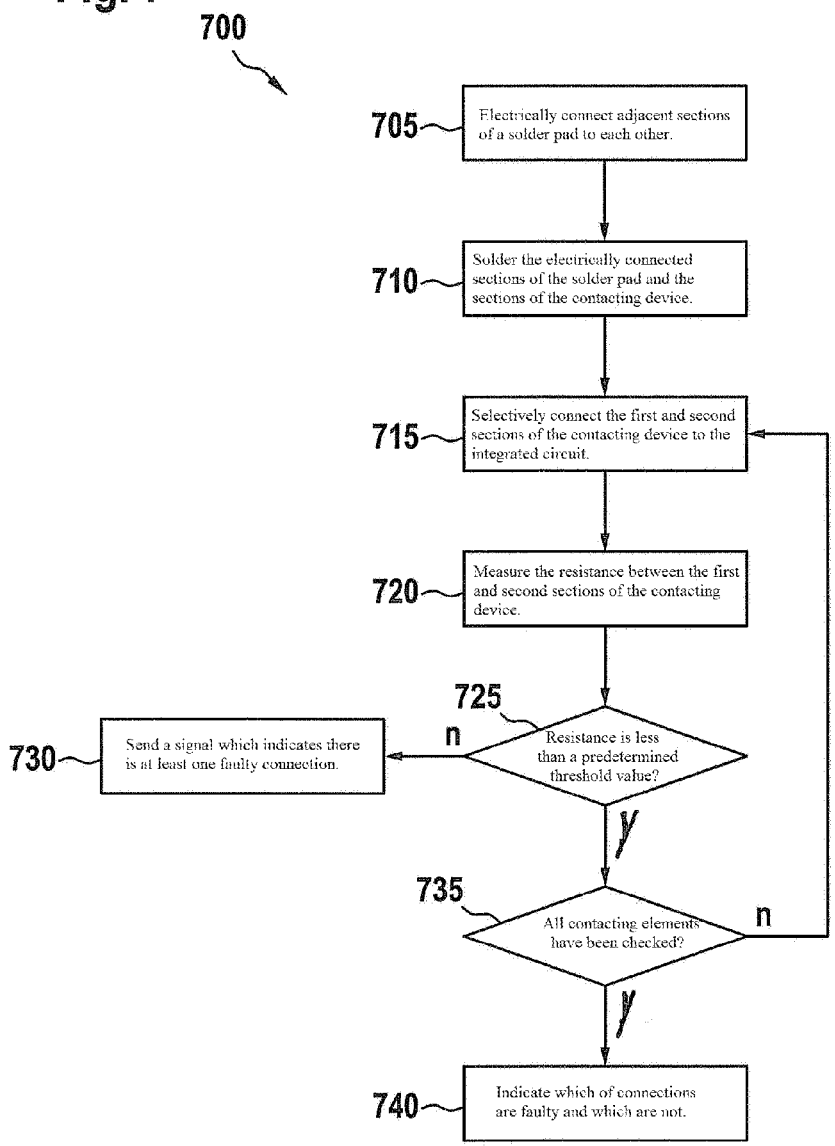

SOLDER JOINT INSPECTION

BACKGROUND INFORMATION

An integrated circuit includes an electronic circuit which is situated on a semiconductor substrate and accommodated in a housing having contact elements. Different housings having different contact elements are available, depending on a planned application or field of application. The contact elements are usually electrically connected to corresponding contact elements of a circuit board using a soldering process. The circuit board usually connects the integrated circuit to additional electronic components.

In vehicle electrical systems, for example, it is often necessary to ensure that the electrical connection between the corresponding contact elements is inspected after the soldering process, for example when a security-relevant system is affected, such as a brake control system. The inspection may be carried out visually, for example. If the solder joints are not immediately visible, as is the case, for example, in a QFN or LGA housing, an inspection may be carried out with the aid of x-ray light. However, this is cost-intensive and may produce ambiguous results if other elements, a bonding wire, for example, is visible in the x-ray image. Alternatively, the reliability of the soldering process may be ensured, for example, by providing the contact elements with solder prior to the soldering process. A so-called presoldering process of this type also generates additional costs.

An object of the present invention is therefore to provide a cost-effective solder joint inspection.

SUMMARY OF THE INVENTION

According to a first aspect of the present invention, an integrated circuit includes an electronic circuit in a housing and a first contacting device for soldering the circuit to a corresponding second contacting device of a circuit board. The first and second contacting devices are each divided into a first section and a second section, the sections of one of the contacting devices being fixedly electrically connected to each other, and the sections of the other contacting device being selectively connectable to a device for resistance determination.

The first sections and the second sections may each be connected to each other with the aid of a soldering process. A total resistance of both series-connected connections may be determined by measuring the resistance between the first and second sections, which are not electrically connected to each other. If one of the two connections is faulty, this is reflected in the determined resistance. A solder joint inspection may thus be carried out electrically without additional measuring equipment.

The electronic circuit may include the device for resistance determination. The contacting device whose sections are connected to each other is situated on the circuit board in this case. After soldering to the circuit board, the integrated circuit may carry out a function test and determine whether its connection to the circuit board is faulty. No special precautions need to be taken on the circuit board for this purpose. The functionality of the resistance determination may be implemented at no appreciable added cost, in particular in the case of application-specific integrated circuits (ASICs). This makes it possible to increase process reliability without significantly raising manufacturing costs at the same time.

The electronic circuit may have a switching device for selectively connecting the device for resistance determination to one of the sections. The resistance determination may thus be selectively activated or deactivated, so that no current flow through the connections needs to be generated during normal operation of the integrated circuit, which follows a resistance determination, thereby making it possible to reduce the electrical power loss of the integrated circuit during normal operation.

The electronic circuit may include a device for comparing the determined resistance with a threshold value. The level of the resistance with regard to the threshold value may be an indicator of whether or not one of the connections is faulty. In one specific embodiment, multiple threshold values are provided, it being possible to determine a quality of the connections from the level of resistance with regard to the threshold values.

The electronic circuit may be configured to output a signal which indicates the comparison result. This makes it possible, for example, to prevent the integrated circuit from starting up if the integrated circuit does not have an adequate electrical connection to the circuit board.

In one specific embodiment, one of the sections of the contacting device of the integrated circuit is fixedly connected to the device for resistance determination. The other section may be assigned to a functionality of the integrated circuit which is independent of the resistance determination. The functionality of the integrated circuit may thus be completely decoupled from the connection inspection according to the present invention.

According to a second aspect, a method is provided for determining a resistance between a contacting device of an integrated circuit which is connected to an electronic circuit and a corresponding contacting device of a circuit board, the contacting devices each being divided into a first section and a second section, the method including steps which involve electrically connecting the sections of one of the contacting devices to each other and determining an electrical resistance between the sections of the corresponding contacting device.

The method preferably also includes a comparison of whether the determined resistance falls below a predetermined threshold value. In particular, a plurality of contacting devices and corresponding contacting devices may be provided, the method including outputting a signal which indicates whether all resistances are below the threshold value. The resistance measurements of the connections of the individual contacting devices are preferably carried out sequentially.

According to a further aspect, a computer program product includes program code means for carrying out the method when the computer program product runs on a processing device or is stored on a machine-readable data carrier. This applies, in particular, if the electronic circuit includes the processing device.

BRIEF DESCRIPTION OF THE DRAWINGS

FIG. 7 shows a flow chart of a method for inspecting the connections on the integrated circuit from FIGS. 1 through 6.

DETAILED DESCRIPTION

Figure 1:
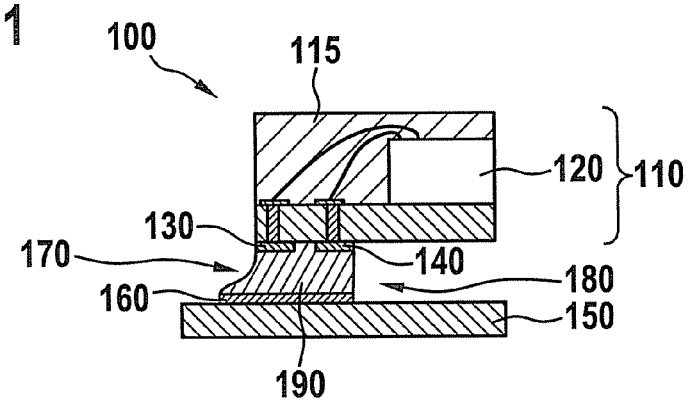
FIG. 1 shows an integrated circuit which is connected to a circuit board.

FIG. 1 shows a system 100 of an integrated circuit 110. Integrated circuit 110 includes a housing 115 in which an electronic circuit 120 is situated. Solder pads 130, 140, which are electrically connected to electronic circuit 120 with the aid of bonding wires, are located on the outside of housing 115. A circuit board 150, which has a further solder pad 160, is located beneath integrated circuit 110. In one specific embodiment, solder pads 130, 140 have a miniaturized design and together are approximately the same size as solder pad 160 on circuit board 150, solder pad 160 preferably having a standardized size. Electrical connections 170 and 180, which are formed by a shared solder joint 190, are situated between solder pad 160 and solder pads 130, 140 of the integrated circuit.

For normal operation of integrated circuit 110, only one of solder pads 130, 140 is needed to connect electronic circuit 120 to solder pad 160 of circuit board 150. To increase the operating reliability of integrated circuit 110 during normal operation, a resistance measurement is carried out between solder pads 130 and 140 of integrated circuit 110 in a test phase which precedes normal operation. In doing so, a current flows through connection 170 from first solder pad 130 to solder pad 160 of circuit board 150, and from there to second solder pad 140 of integrated circuit 110 via connection 180. A flow in the opposite direction is also possible.

A resistance is determined which includes the two series-connected connections 170 and 180. If both connections 170 and 180 are fault-free, a resistance value between solder pads 130 and 140 typically lies in the range of just a few mΩ.

Figure 2:
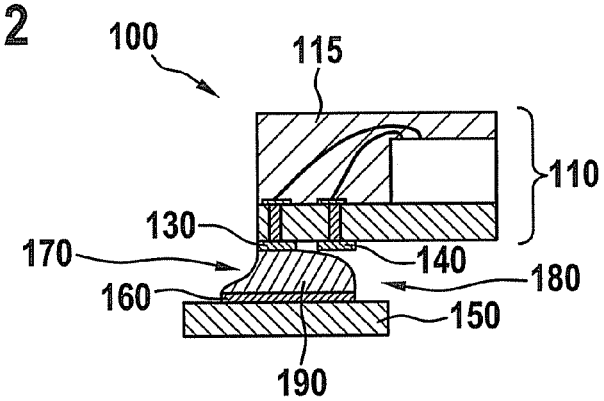
FIG. 2 shows the integrated circuit from FIG. 1 having a faulty connection.

FIG. 2 shows integrated circuit 110 from FIG. 1, which has a faulty connection 180. Connection 180 is only partially established because solder joint 190 has only partially wetted solder pad 140. A connection of this type is also known as a "cold solder joint." In this case, the electrical resistance between solder pads 130 and 140 lies in the range of several Ω. The resistance value between solder pads 130 and 140 may be even higher if other connection 170 is also faulty or if one of solder pads 130, 140 is not at all wetted by solder joint 190. In this case, the resistance between solder pads 130 and 140 typically lies in the range of several mΩ to an infinite value.

Figure 3:
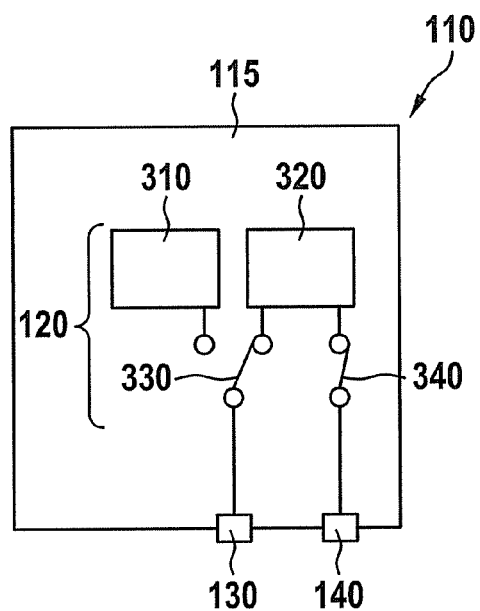
FIG. 3 shows an equivalent circuit diagram of the integrated circuit from FIGS. 1 and 2.

FIG. 3 shows an equivalent circuit diagram of integrated circuit 110 from FIGS. 1 and 2. Housing 115, on whose outside solder pads 130 and 140 are situated, is shown in a schematic representation. Electronic circuit 120 is accommodated in housing 115 and connected to solder pads 130 and 140 with the aid of bonding wires.

Electronic circuit 120 includes a first function module 310 and a second function module 320. A first switch 330 selectively connects solder pad 130 to first function module 310 or to second function module 320. A second switch 340 selectively establishes a connection between solder pad 140 and second function module 320.

First function module 310 represents the portion of electronic circuit 120 which is used during normal operation of integrated circuit 110. Second function module 320 is the portion of electronic circuit 120 which may be used to carry out a resistance measurement between solder pads 130 and 140. This measurement is usually carried out before integrated circuit 110 goes into normal operation.

To determine the resistance between solder pads 130 and 140, first switch 330 is in the illustrated position, in which solder pad 130 is connected to second function module 320. Second switch 340 is closed as illustrated.

For normal operation, first switch 330 is flipped so that it connects solder pad 130 to first function module 310. At the same time, second switch 340 is opened to prevent a current from flowing from second function module 320 to first function module 310 via switch 340, solder pad 140, solder joint 190, solder pad 130 and first switch 330. If a current of this type is negligible or desired, second switch 340 may be omitted and replaced by a fixed connection.

Figure 4:
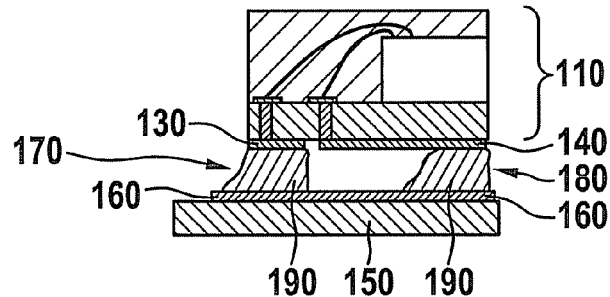
FIGS. 4 through 6 show variants of the integrated circuit from FIGS. 1 and 2.

FIG. 4 shows a variant of integrated circuit 110 from FIGS. 1 and 2. In contrast to the representation in FIG. 1, solder pads 130 and 140 of integrated circuit 110 are spaced farther apart and are located opposite separately formed solder pads 160 on circuit board 150. Solder pads 160 on circuit board 150 are electrically connected to each other with the aid of a printed conductor. Connection 170 between solder pad 130 and left solder pad 160 is established by a first solder joint 190, and connection 180 between solder pad 140 and right solder pad 160 of circuit board 150 is established by a second solder joint 190. The specific embodiment uses solder pads 130, 140 which have a common size and grid spacing, so that it is not necessary to provide miniaturized solder pads 130, 140 on integrated circuit 110, as described above with reference to FIG. 1. This makes it possible, for example, to increase a current carrying capacity of connections 170 and 180. If necessary, the producibility of solder joints 190 may also be improved. In addition, this makes it possible to reduce a probability that, while a solder joint 190 has good connections to solder pads 130 and 140, it nevertheless has a poor connection or no connection at all to solder pad 160 of circuit board 150.

Figure 5:
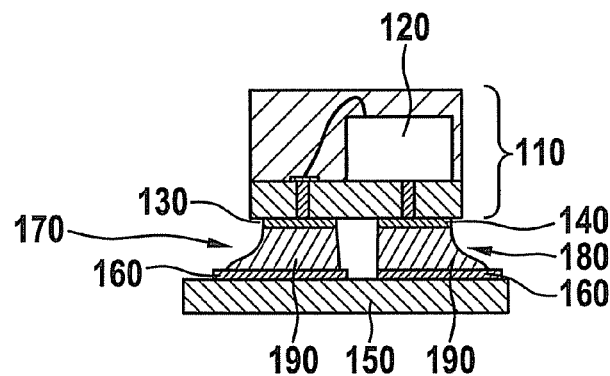

FIG. 5 shows a further variant of integrated circuit 110 from FIGS. 1 and 2. In contrast to the representation in FIG. 4, solder pads 160 of circuit board 150 are not electrically connected to each other. In determining a resistance of connections 170 and 180, this specific embodiment takes the opposite approach in that solder pads 130 and 140 are electrically connected to each other within electronic circuit 120 using a function of electronic circuit 120 according to FIG. 3. The resistance is then determined on the part of circuit board 150 by determining the resistance between the two solder pads 160. In this case, second function module 320 from FIG. 3 may correspond to a predetermined resistance, in particular the short-circuit of 0Ω.

In another specific embodiment, second function module 320 may include a predetermined resistance which is greater than 0Ω and above which a voltage drops which is proportional to a current flowing through solder pads 160 of circuit board 150. The resistance is then measured by applying a predetermined voltage between solder pads 160, for example with the aid of further components on circuit board 150, and by determining the current flowing through connections 170 and 180 on the basis of the voltage drop in second function module 320. In addition to using components which are situated on circuit board 150, the voltage between solder pads 160 may also be produced with the aid of external test equipment, for example with the aid of test pins which contact solder pads 160 during the test phase.

Figure 6:
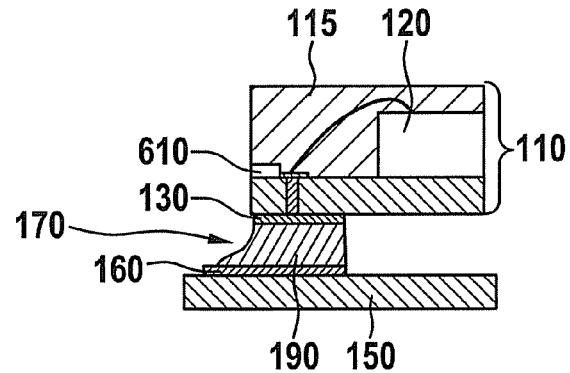

FIG. 6 shows a further variant of integrated circuit 110 from FIGS. 1 through 5. In contrast to the representation in FIG. 1, only one connection 170 exists between integrated circuit 160 and circuit board 150. In addition to solder pad 130, there is also a pin terminal 610 which is accessible on the side of housing 115 and which is part of an electrical connection between solder pad 130 and electronic circuit 120. The quality of electrical connection 170 may be determined by determining the electrical resistance between pin terminal 610 and solder pad 160 of circuit board 150.

FIG. 7 shows a flow chart of a method 700 for inspecting the connections on integrated circuit 110 from FIGS. 1 through 6. In a first step 705, adjacent sections of solder pad 160 on circuit board 150 are electrically connected to each other. This may be provided, for example, in the form of a printed circuit, during the manufacture of circuit board 150.

In a subsequent step 710, connections 170 and 180 are established between corresponding solder pads 130, 140 and 160. This step may include producing solder joints 190. In step 715, second function module 320 is connected to solder pads 130 and 140 with the aid of first switch 330 and second switch 340. In step 720, a resistance measurement is subsequently carried out between solder pads 130 and 140.

In a step 725, it is determined whether the determined resistance is less than a predetermined threshold value. This threshold value usually lies in the range of just a few Ω. If the determined resistance falls below this threshold value, it may be assumed that connections 170 and 180 are in proper condition. If it is determined in step 725 that the resistance determined in step 720 exceeds the threshold value, a signal is output in a step 730 which indicates at least one faulty connection 170, 180 between integrated circuit 110 and circuit board 150. In the illustrated variant, method 700 ends in step 730. In a further variant, the method may continue in a step 735, which otherwise follows step 725, after the signal has been output. In step 735, a check is carried out to determine whether all contacting elements 130, 140 of integrated circuit 110 have already been checked. If this is not the case, method 700 continues with step 715, where a different contact element 130, 140 is checked.

If it is determined in step 735 that all contact elements 130, 140 have been checked, a signal which indicates fault-free connections 170, 180 is output in an optional final step 740. In the event that the method is continued with step 735 after step 730, a more differentiated result may be output in step 740, for example an indication of which of connections 170, 180 are faulty and which are not.

What is claimed is:

1. An integrated circuit comprising:
    an electronic circuit in a housing; and
    a first contacting device for soldering to a corresponding second contacting device of a printed circuit board, each of the first and second contacting devices being divided into a first section and a second section, the first and second sections of one of the contacting devices being fixedly electrically connected to each other, the first and second sections of the other contacting device being selectively connectable to the electronic circuit for determining a resistance.

2. The integrated circuit according to claim 1, wherein the electronic circuit includes the device for determining the resistance.

3. The integrated circuit according to claim 2, wherein the electronic circuit has a switching device for selectively connecting the resistance-determining device to one of the sections.

4. The integrated circuit according to claim 2, wherein the electronic circuit includes a device for comparing a determined resistance value with a threshold value.

5. The integrated circuit according to claim 4, wherein the electronic circuit is configured to output a signal which indicates a comparison result.

6. The integrated circuit according to claim 1, wherein one of the sections of the first contacting device is fixedly connected to the resistance-determining device.

7. A method for determining a resistance between a contacting device of an integrated circuit which is connected to an electronic circuit and a corresponding contacting device of a circuit board, the contacting devices each being divided into a first section and a second section, the method comprising:
    soldering the first and second sections of one of the contacting devices to each other;
    selectively connect the first and second sections of the other contacting device to the integrated circuit; and
    determining an electrical resistance between the selectively connected first and second sections of the corresponding contacting device.

8. The method according to claim 7, further comprising comparing whether the determined resistance falls below a predetermined threshold value.

9. The method according to claim 8, wherein a plurality of contacting devices of an integrated circuit which is connected to an to an electronic circuit and corresponding contacting devices of a circuit board are provided, and further comprising outputting a signal which indicates whether all resistances are below the threshold value.

10. A computer-readable medium containing a computer program which when executed by a processor performs the following method for determining a resistance between a contacting device of an integrated circuit which is connected to an electronic circuit and a corresponding contacting device of a circuit board, the contacting devices each being divided into a first section and a second section:
    soldering the first and second sections of one of the contacting devices to each other;
    selectively connect the first and second sections of the other contacting device to the integrated circuit; and
    determining an electrical resistance between the selectively connected first and second sections of the corresponding contacting device.

* * * * *